(12) United States Patent
Heng et al.

(10) Patent No.: US 9,537,032 B2
(45) Date of Patent: Jan. 3, 2017

(54) LOW-COST HIGH-EFFICIENCY SOLAR MODULE USING EPITAXIAL SI THIN-FILM ABSORBER AND DOUBLE-SIDED HETEROJUNCTION SOLAR CELL WITH INTEGRATED MODULE FABRICATION

(75) Inventors: Jiunn Benjamin Heng, Redwood City, CA (US); Chentao Yu, Sunnyvale, CA (US); Zheng Xu, Pleasanton, CA (US); Jianming Fu, Palo Alto, CA (US); Peijun Ding, Saratoga, CA (US)

(73) Assignee: SolarCity Corporation, San Mateo, CA (US)

( * ) Notice: Subject to any disclaimer, the term of this patent is extended or adjusted under 35 U.S.C. 154(b) by 1344 days.

(21) Appl. No.: 12/476,991

(22) Filed: Jun. 2, 2009

(65) Prior Publication Data

US 2010/0300506 A1    Dec. 2, 2010

Related U.S. Application Data

(60) Provisional application No. 61/183,308, filed on Jun. 2, 2009.

(51) Int. Cl.
| | |
|---|---|
| *H01L 31/048* | (2014.01) |
| *H01L 31/0352* | (2006.01) |
| *H01L 31/0745* | (2012.01) |
| *H01L 31/18* | (2006.01) |
| *H01L 31/0236* | (2006.01) |

(Continued)

(52) U.S. Cl.
CPC ....... *H01L 31/048* (2013.01); *H01L 31/02363* (2013.01); *H01L 31/03529* (2013.01); *H01L 31/0488* (2013.01); *H01L 31/0508* (2013.01); *H01L 31/0745* (2013.01); *H01L 31/0747* (2013.01); *H01L 31/1804* (2013.01);

(Continued)

(58) Field of Classification Search
None
See application file for complete search history.

(56) References Cited

U.S. PATENT DOCUMENTS

| | | | | |
|---|---|---|---|---|
| 4,567,642 | A * | 2/1986 | Dilts et al. | 438/61 |
| 5,286,306 | A * | 2/1994 | Menezes | 136/249 |

(Continued)

OTHER PUBLICATIONS

Merriam-Webster online dictionary—"mesh". (accessed Oct. 8, 2012).*

*Primary Examiner* — Jennifer Michener
*Assistant Examiner* — Christopher Danicic
(74) *Attorney, Agent, or Firm* — Shun Yao; Park, Vaughan, Fleming & Dowler LLP

(57) ABSTRACT

One embodiment of the present invention provides a double-sided heterojunction solar cell module. The solar cell includes a frontside glass cover, a backside glass cover situated below the frontside glass cover, and a number of solar cells situated between the frontside glass cover and the backside glass cover. Each solar cell includes a semiconductor multilayer structure situated below the frontside glass cover, including: a frontside electrode grid, a first layer of heavily doped amorphous Si (a-Si) situated below the frontside electrode, a layer of lightly doped crystalline-Si (c-Si) situated below the first layer of heavily doped a-Si, and a layer of heavily doped c-Si situated below the lightly doped c-Si layer. The solar cell also includes a second layer of heavily doped a-Si situated below the multilayer structure; and a backside electrode situated below the second layer of heavily doped a-Si.

33 Claims, 11 Drawing Sheets

(51) Int. Cl.
*H01L 31/05* (2014.01)
*H01L 31/0747* (2012.01)

(52) U.S. Cl.
CPC ........ *H01L 31/1896* (2013.01); *Y02E 10/547* (2013.01); *Y02P 70/521* (2015.11)

(56) References Cited

U.S. PATENT DOCUMENTS

| | | | |
|---|---|---|---|
| 2004/0112426 A1* | 6/2004 | Hagino | 136/261 |
| 2005/0012095 A1* | 1/2005 | Niira et al. | 257/41 |
| 2005/0133084 A1* | 6/2005 | Joge et al. | 136/255 |
| 2006/0130891 A1* | 6/2006 | Carlson | 136/256 |
| 2006/0213548 A1* | 9/2006 | Bachrach et al. | 136/251 |
| 2008/0276983 A1* | 11/2008 | Drake et al. | 136/251 |
| 2008/0302030 A1* | 12/2008 | Stancel et al. | 52/173.3 |

* cited by examiner

FIG. 2A
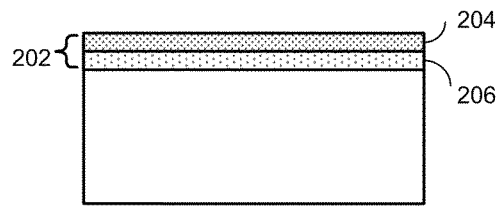
FIG. 2B
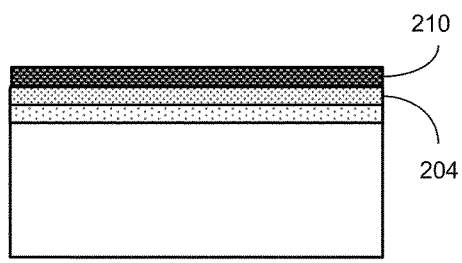
FIG. 2C
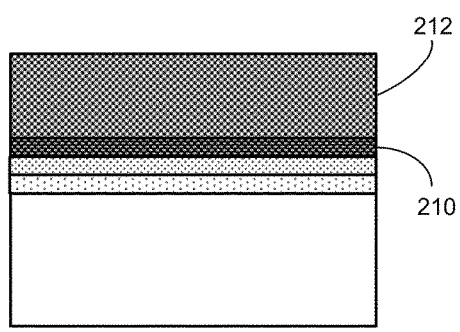
FIG. 2D
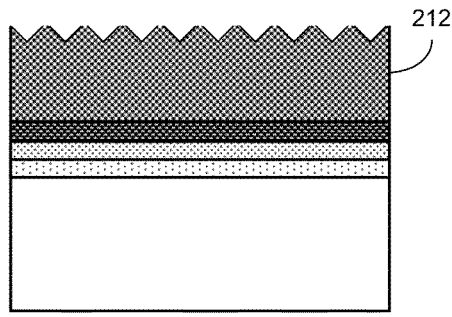
FIG. 2E
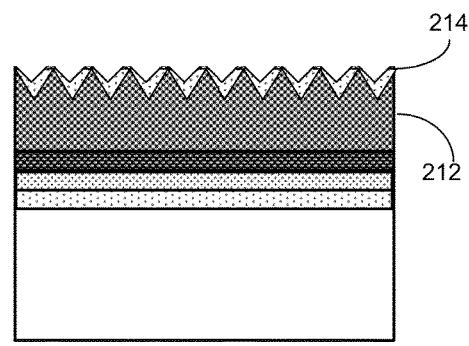
FIG. 2F
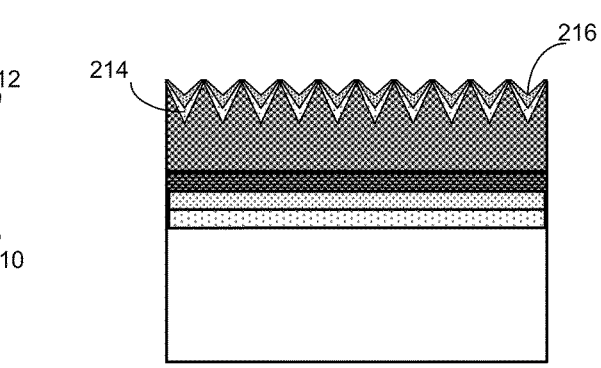
FIG. 2G
FIG. 2

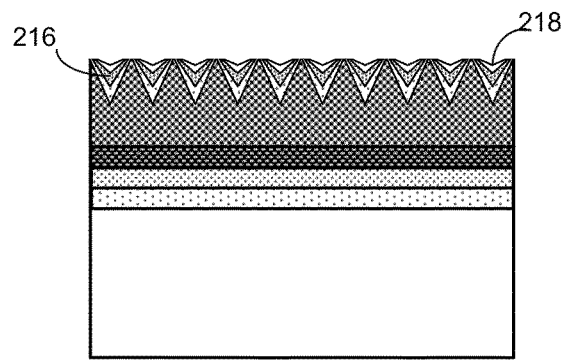
FIG. 2H
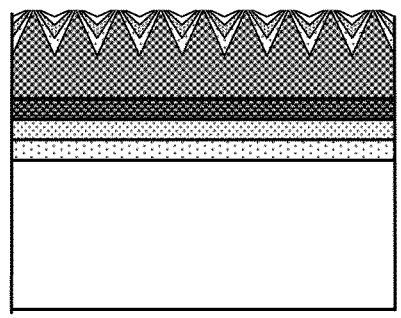
FIG. 2I
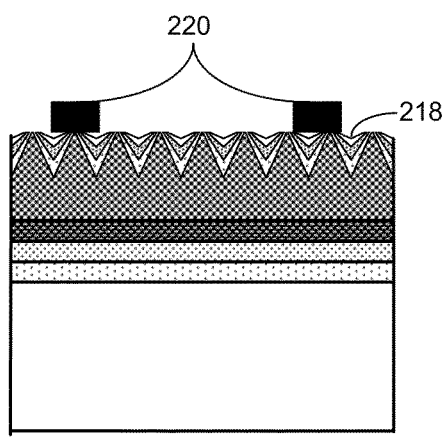
FIG. 2J
FIG. 2 (continued)

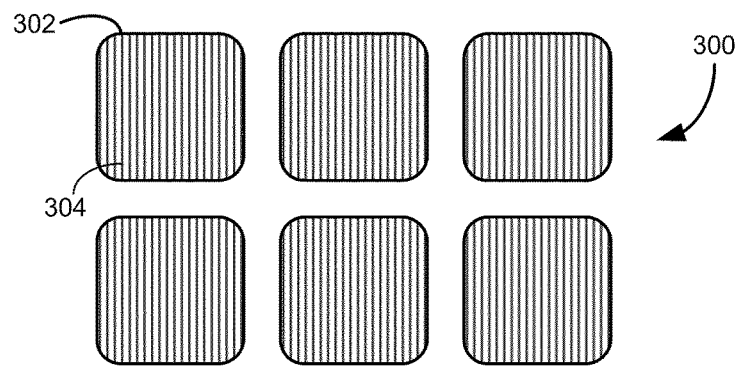
FIG. 3A
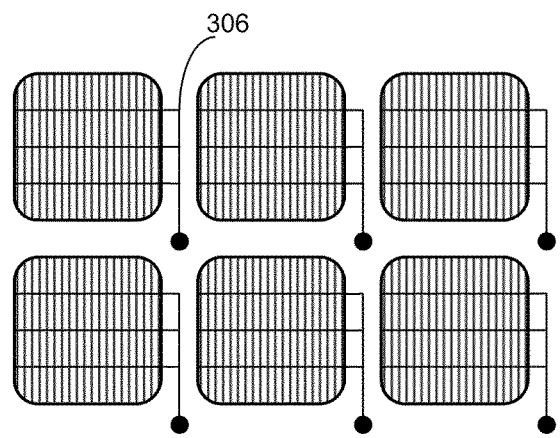
FIG. 3B
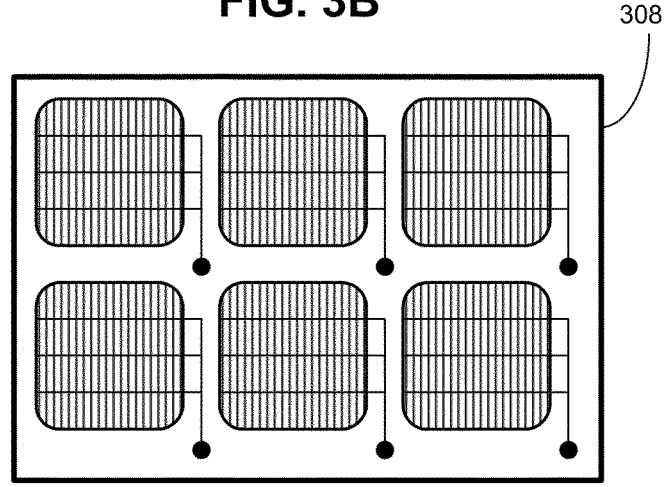
FIG. 3C
FIG. 3

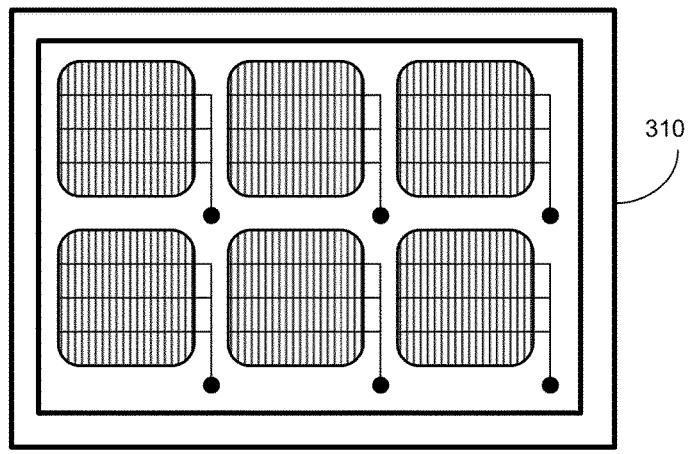
FIG. 3D
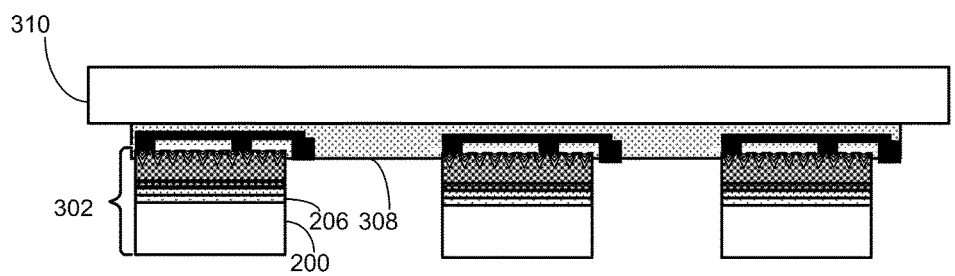
FIG. 3E
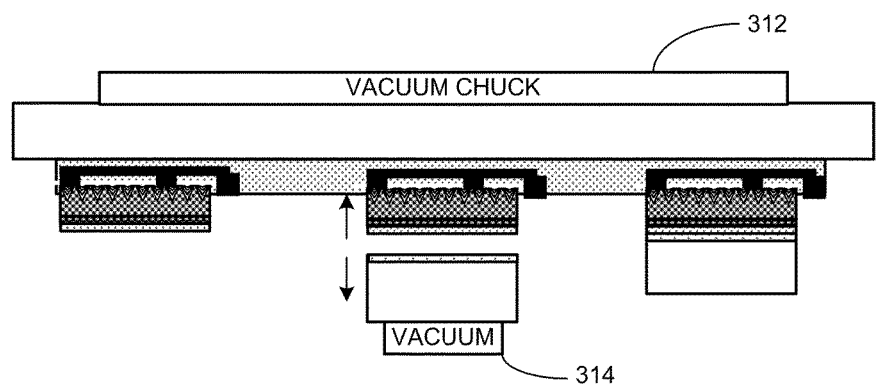
FIG. 3F
FIG. 3 (continued)

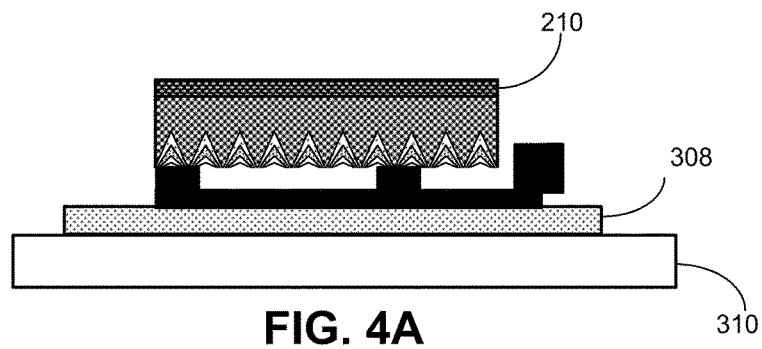
FIG. 4A
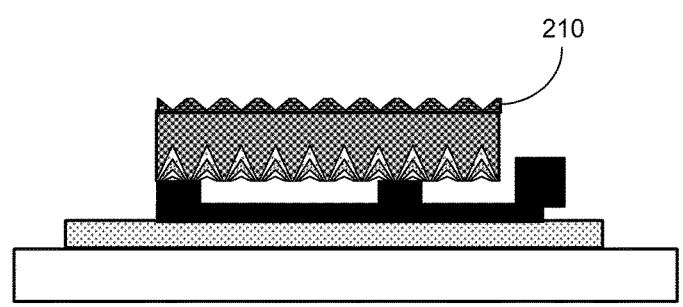
FIG. 4B
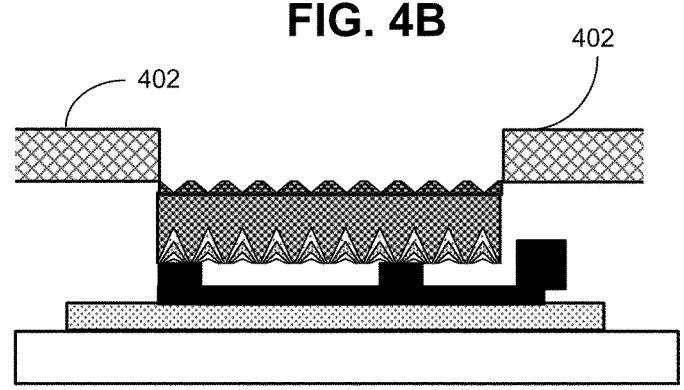
FIG. 4C
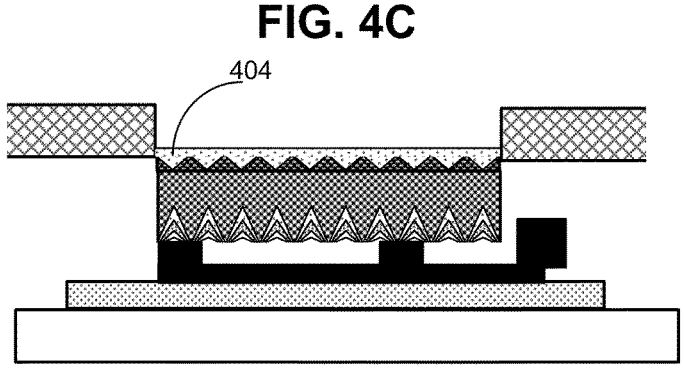
FIG. 4D
FIG. 4

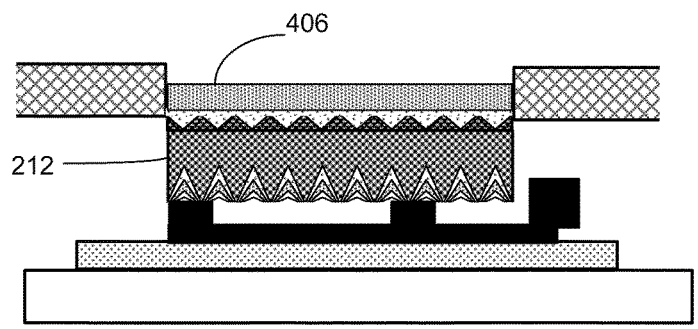
FIG. 4E
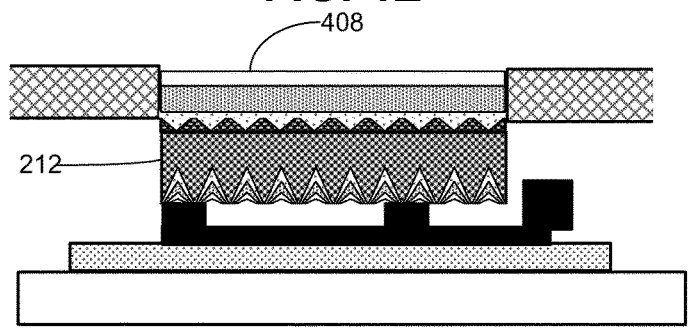
FIG. 4F
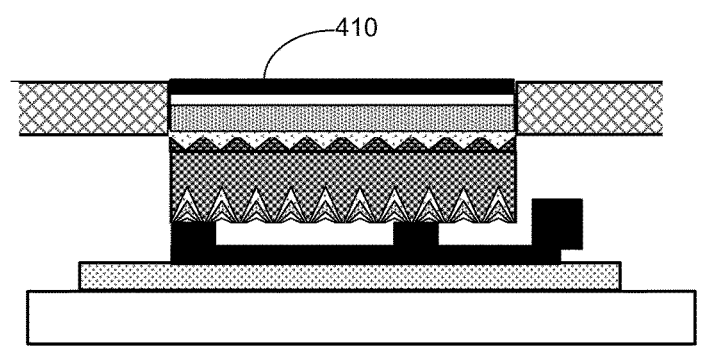
FIG. 4G
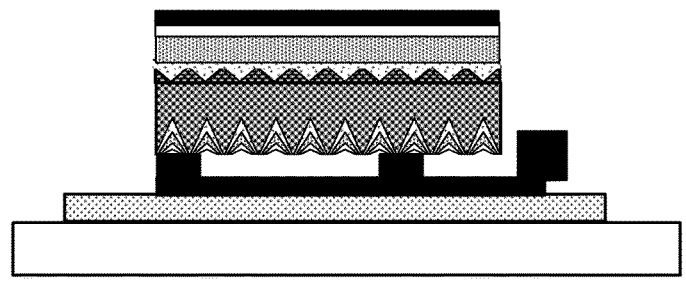
FIG. 4H
FIG. 4 (continued)

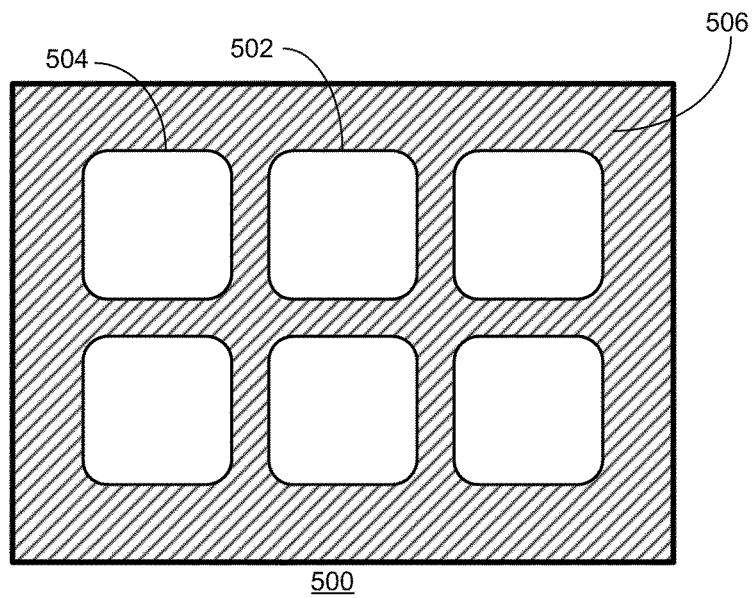
FIG. 5A
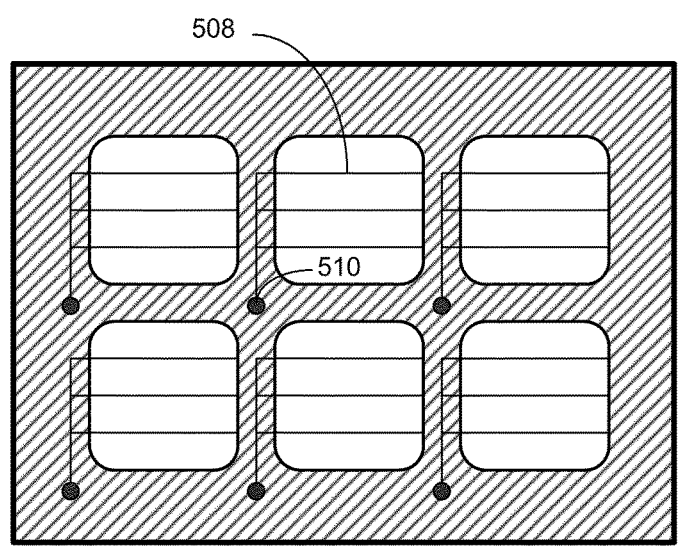
FIG. 5B
FIG. 5

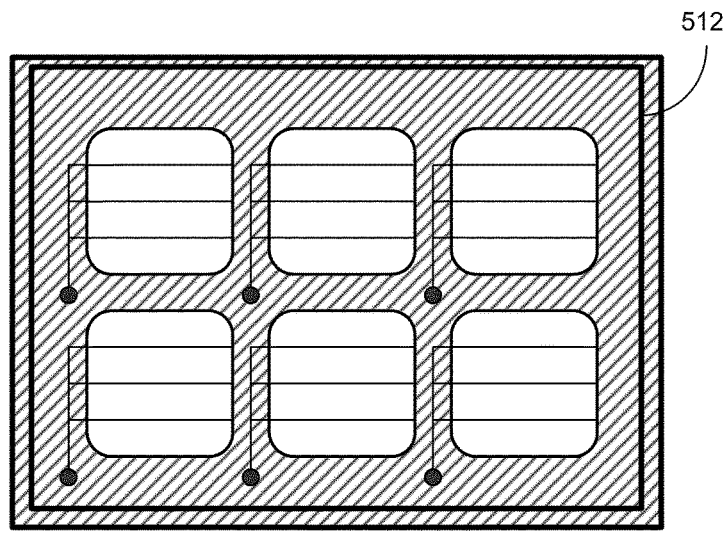
FIG. 5C
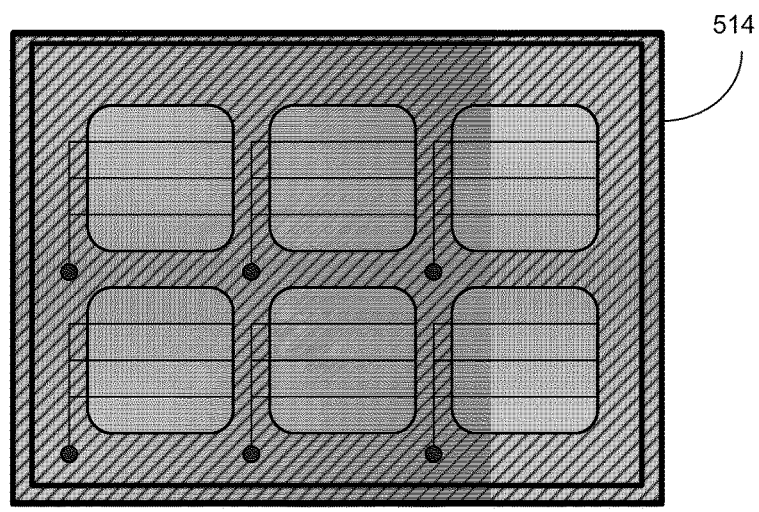
FIG. 5D
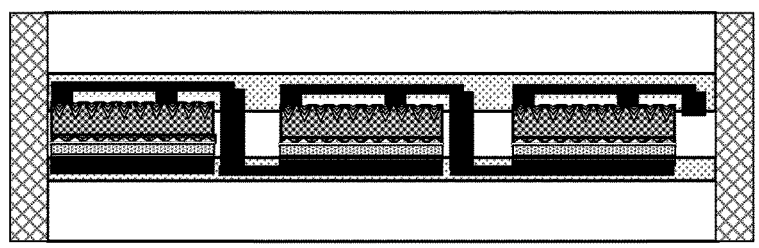
FIG. 5E
FIG. 5 (continued)

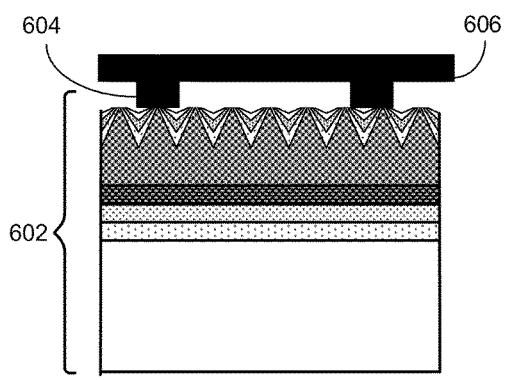
FIG. 6A
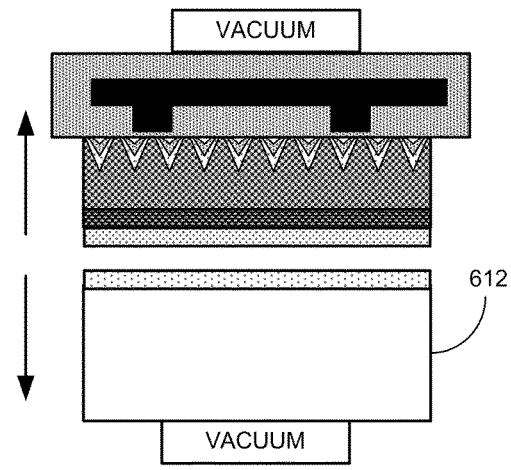
FIG. 6C
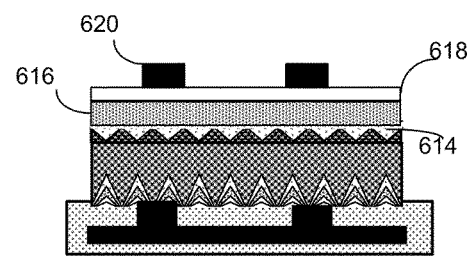
FIG. 6D
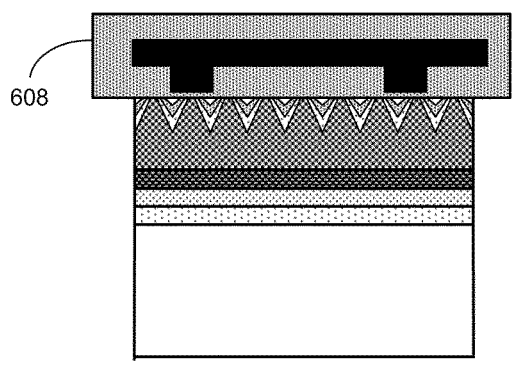
FIG. 6B
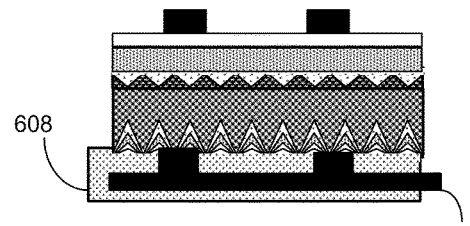
FIG. 6E
FIG. 6

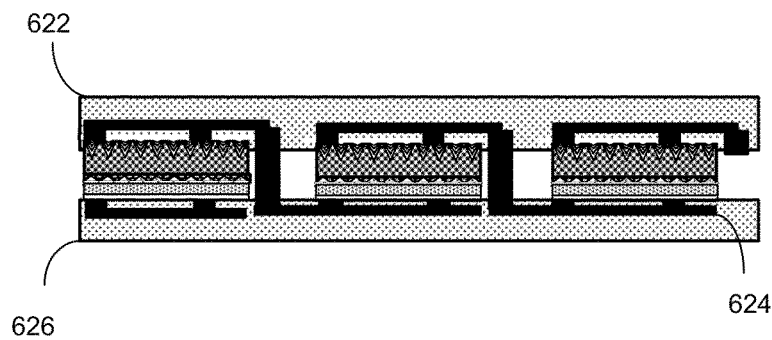
FIG. 6F
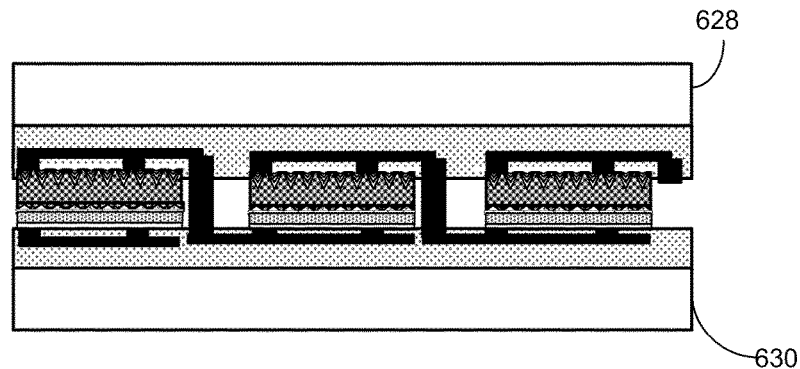
FIG. 6G
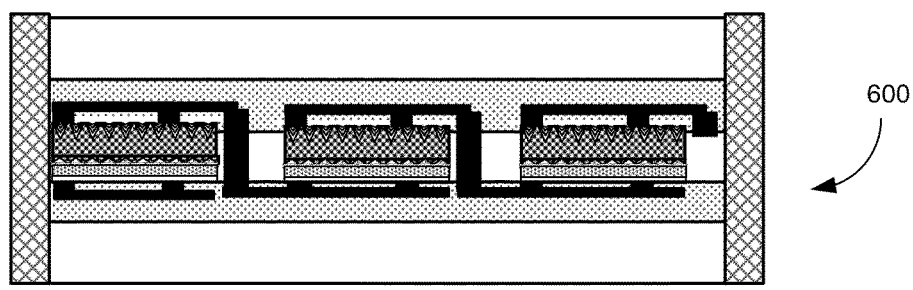
FIG. 6H
FIG. 6 (continued)

LOW-COST HIGH-EFFICIENCY SOLAR MODULE USING EPITAXIAL SI THIN-FILM ABSORBER AND DOUBLE-SIDED HETEROJUNCTION SOLAR CELL WITH INTEGRATED MODULE FABRICATION

RELATED APPLICATION

This application claims the benefit of U.S. Provisional Application No. 61/183,308, entitled "High Efficiency, Low Cost Photovoltaic Modules Based on Thin Epitaxial Silicon and Substrate Reuse," by inventors Jiunn Benjamin Heng, Chentao Yu, Zheng Xu, Jianming Fu, and Peijun Ding, filed 2 Jun. 2009.

BACKGROUND

Field

This disclosure is generally related to solar cells. More specifically, this disclosure is related to a solar cell module based on double-sided heterojunction solar cells with epitaxial Si thin-film absorber.

Related Art

The negative environmental impact caused by the use of fossil fuels and their rising cost have resulted in a dire need for cleaner, cheaper alternative energy sources. Among different forms of alternative energy sources, solar power has been favored for its cleanness and wide availability.

A solar cell converts light into electricity using the photoelectric effect. There are several basic solar cell structures, including a single p-n junction, p-i-n/n-i-p, and multi-junction. A typical single p-n junction structure includes a p-type doped layer and an n-type doped layer. Solar cells with a single p-n junction can be homojunction solar cells or heterojunction solar cells. If both the p-doped and n-doped layers are made of similar materials (materials with equal band gaps), the solar cell is called a homojunction solar cell. In contrast, a heterojunction solar cell includes at least two layers of materials of different bandgaps. A p-i-n/n-i-p structure includes a p-type doped layer, an n-type doped layer, and an intrinsic (undoped) semiconductor layer (the i-layer) sandwiched between the p-layer and the n-layer. A multi junction structure includes multiple single junction structures of different bandgaps stacked on top of one another.

In a solar cell, light is absorbed near the p-n junction generating carriers. The carriers diffuse into the p-n junction and are separated by the built-in electric field, thus producing an electrical current across the device and external circuitry. An important metric in determining a solar cell's quality is its energy-conversion efficiency, which is defined as the ratio between power converted (from absorbed light to electrical energy) and power collected when the solar cell is connected to an electrical circuit.

For homojunction solar cells, minority-carrier recombination at the cell surface due to the existence of dangling bonds can significantly reduce the solar cell efficiency; thus, a good surface passivation process is needed. In addition, the relatively thick, heavily doped emitter layer, which is formed by dopant diffusion, can drastically reduce the absorption of short wavelength light. Comparatively, heterojunction solar cells, such as Si heterojunction (SHJ) solar cells, are advantageous. FIG. 1 presents a diagram illustrating an exemplary SHJ solar cell (prior art). SHJ solar cell 100 includes front electrodes 102, an $n^+$ amorphous-silicon ($n^+$ a-Si) emitter layer 104, an intrinsic a-Si layer 106, a p-type doped crystalline-Si (c-Si) substrate 108, and an Al backside electrode 110. Arrows in FIG. 1 indicate incident sunlight. Because there is an inherent bandgap offset between a-Si layer 106 and c-Si layer 108, a-Si layer 106 can be used to reduce the surface recombination velocity by creating a barrier for minority carriers. The a-Si layer 106 also passivates the surface of c-Si layer 108 by repairing the existing Si dangling bonds. Moreover, the thickness of $n^+$ a-Si emitter layer 104 can be much thinner compared to that of a homojunction solar cell. Thus, SHJ solar cells can provide a higher efficiency with higher open-circuit voltage ($V_{oc}$) and larger short-circuit current ($J_{sc}$).

Fuhs et al. first reported a hetero-structure based on a-Si and c-Si that generates photocurrent in 1974 (see W. Fuhs et al., "*Heterojunctions of Amorphous Silicon & Silicon Single Crystal*," Int. Conf., Tetrahedrally Bonded Amorphous Semiconductors, Yorktown Hts., N.Y., (1974), pp. 345-350). U.S. Pat. No. 4,496,788 disclosed a heterojunction type solar cell based on stacked a-Si and c-Si wafers. The so-called HIT (heterojunction with intrinsic thin layer) solar cell, which includes an intrinsic a-Si layer interposed between a-Si and c-Si layers, was disclosed by U.S. Pat. No. 5,213,628. However, all these SHJ solar cells are based on a crystalline-Si substrate whose thickness can be between 200 μm and 300 μm. Due to the soaring cost of Si material, the existence of such a thick c-Si substrate significantly increases the manufacture cost of existing SHJ solar cells. To solve the problem of high cost incurred by c-Si wafers, a solution is to epitaxially grow a c-Si thin film on a low-cost MG-Si wafer, thus eliminating the need for c-Si wafers. However, such an approach has its own limitations in terms of solar cell efficiency. In a heterojunction solar cell with MG-Si substrate, the light passing through the active epitaxial c-Si film will be subsequently absorbed by the MG-Si substrate, thus limiting the amount of generated $J_{sc}$. In addition, the lack of effective passivation between the back surface of the c-Si film and the MG-Si substrate limits the $V_{oc}$ as well as $J_{sc}$ due to the significant back surface minority carrier recombination.

One approach to achieve a low-cost and high-efficiency solar cell is to transfer solar cells epitaxially grown on a semiconductor grade c-Si wafer to a low-cost substrate. However, such a process can still consume the c-Si wafer during the transfer. Moreover, the wafer thickness needs to be more than 500 μm to ensure effective transfer and minimum wafer breakage, making cost an issue.

SUMMARY

One embodiment of the present invention provides a double-sided heterojunction solar cell module. The solar cell includes a frontside glass cover, a backside glass cover situated below the frontside glass cover, and a number of solar cells situated between the frontside glass cover and the backside glass cover. Each solar cell includes a semiconductor multilayer structure situated below the frontside glass cover, including: a frontside electrode grid, a first layer of heavily doped amorphous Si (a-Si) situated below the frontside electrode, a layer of lightly doped crystalline-Si (c-Si) situated below the first layer of heavily doped a-Si, and a layer of heavily doped c-Si situated below the lightly doped c-Si layer. The solar cell also includes a second layer of heavily doped a-Si situated below the multilayer structure, and a backside electrode situated below the second layer of heavily doped a-Si.

In a variation on the embodiment, the multilayer structure is epitaxially grown on the surface of a metallurgical-Si (MG-Si) substrate.

In a further variation, the MG-Si substrate further comprises a layer of porous Si.

In a further variation, the MG-Si substrate is removed prior to the formation of the second layer of heavily doped a-Si using one or more of the following techniques: chemical etching, applying a shear or piezoelectric force, applying a temperature gradient, applying an ultra/mega-sonic force, applying a tensile or compressive mechanical force, and pumping a pressurized gas into the porous Si layer.

In a variation on the embodiment, at least one side of the lightly doped c-Si layer is textured.

In a variation on the embodiment, the solar cell module further includes a first adhesive polymer layer situated between the frontside glass cover and the solar cells. The adhesive polymer layer, the frontside glass cover, and the solar cells are laminated together by applying heat and pressure.

In a further variation, the solar cell module includes a layer of frontside metal wires situated between the frontside electrode grid and the polymer layer. The frontside metal wires are soldered to the frontside electrode grid during the lamination process.

In a further variation, the refractive index of the polymer matches the glass's refractive index.

In a variation on the embodiment, the solar cell module includes a second adhesive polymer layer situated between the backside glass cover and the backside electrode. The backside electrode comprises Ag or Al finger grid.

In a further variation, the solar cell module includes a layer of backside metal wires situated between the backside electrode grid and the second polymer layer. The backside metal wires are aligned to corresponding frontside metal wires, thereby forming an electrical connection between adjacent solar cells.

In a variation on the embodiment, the frontside glass region between individual solar cells is protected by a mask during a subsequent fabrication process.

In a variation on the embodiment, each solar cell further comprises at least one layer of transparent conductive oxide (TCO) material situated between an electrode and a heavily doped a-Si layer.

In a variation on the embodiment, the lightly doped crystalline-Si layer is deposited using a CVD technique. The thickness of the lightly doped crystalline-Si layer is between 5 µm and 100 µm, and the doping concentration for the lightly doped crystalline-Si layer is between $1\times10^{16}/cm^3$ and $1\times10^{17}/cm^3$.

In a variation on the embodiment, at least one heavily doped a-Si layer is deposited using a CVD technique. The thickness of the at least one heavily doped a-Si layer is between 10 nm and 50 nm, and the doping concentration for the at least one heavily doped a-Si layer is between $1\times10^{17}/cm^3$ and $1\times10^{20}/cm^3$.

In a variation on the embodiment, the heavily doped and lightly doped c-Si layers are n-type doped, wherein the first heavily doped a-Si layer is p-type doped, and wherein the second heavily doped a-Si layer is n-type doped.

In a variation on the embodiment, the heavily doped crystalline-Si layer acts as a back-surface-field (BSF) layer. The heavily doped crystalline-Si layer is deposited using a chemical-vapor-deposition (CVD) technique. The thickness of the heavily doped crystalline-Si layer is between 1 µm and 10 µm. The doping concentration for the heavily doped crystalline-Si layer is between $1\times10^{17}/cm^3$ and $1\times10^{20}/cm^3$.

In a variation on the embodiment, the solar cell module includes at least one passivation layer on at least one side of the lightly doped c-Si layer. The thickness of the passivation layer is between 1 nm and 10 nm, and the passivation layer includes at least one of: undoped a-Si and $SiO_x$.

BRIEF DESCRIPTION OF THE FIGURES

FIG. 2 presents a diagram illustrating the process of fabricating a heterojunction multilayer structure in accordance with an embodiment of the present invention.

FIG. 3 presents a diagram illustrating the process of transferring the multilayer structure to a glass cover in accordance with an embodiment of the present invention.

FIG. 4 presents a diagram illustrating the process of fabricating backside heterojunctions in accordance with an embodiment of the present invention.

FIG. 5 presents a diagram illustrating a process of applying a backside protective cover to the solar cell module in accordance with an embodiment of the present invention.

FIG. 6 presents a diagram illustrating a process of fabricating a double-sided heterojunction single wafer solar cell in accordance with an embodiment of the present invention.

In the figures, like reference numerals refer to the same figure elements.

DETAILED DESCRIPTION

Figure 1:
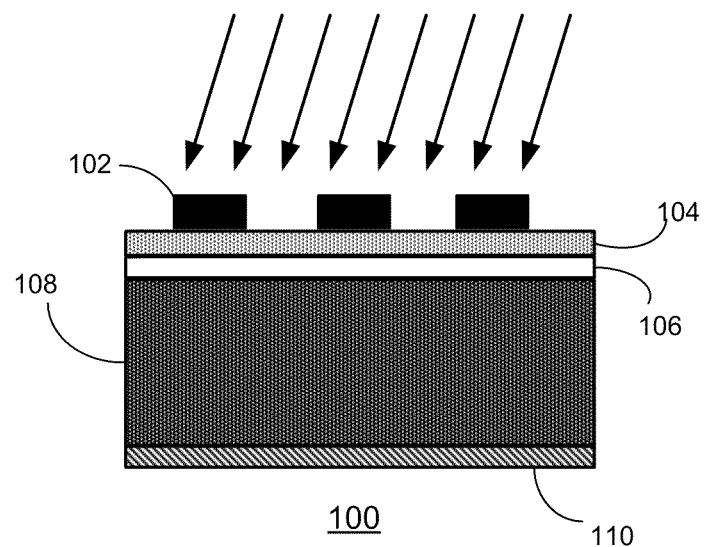
FIG. 1 presents a diagram illustrating an exemplary SHJ solar cell (prior art).

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

Overview

Embodiments of the present invention provide a "double-sided" heterojunction solar cell module. To fabricate a double-sided heterojunction solar cell, a multilayer heterojunction structure is first grown on top of an MG-Si substrate. The multilayer structure includes a thin layer of heavily doped c-Si acting as a back-surface-field (BSF) layer, a layer of lightly doped c-Si on top of the heavily doped c-Si layer as a base layer, a thin layer of intrinsic a-Si acting as a passivation layer, and a layer of heavily doped a-Si as an emitter. In addition, the multilayer structure includes a layer of transparent-conducting-oxide (TCO) and a frontside electrode grid. In order to be able to passivate the backside of the base film, some embodiments transfer the multilayer structure to a glass cover and subsequently remove the MG-Si substrate. Some embodiments implement a low-cost modular process in which a number of fabricated multilayer structures are laminated to a glass cover with the assistance of an adhesive polymer layer. The removed substrate can be recycled for future fabrication. After the removal of the MG-Si substrates, a thin layer of intrinsic a-Si and a thin layer of heavily doped a-Si are deposited on the backside of the base films to effectively passivate the backside of the base films. Subsequently, a layer of TCO and a backside electrode are deposited, and a backside glass cover is laminated to finish the module fabrication. To provide electrical connection to and from a solar cell, Cu wires are pre-laid between the glass covers and the electrodes, and the soldering of the Cu wires to the electrodes is performed concurrently with the lamination process.

Heterojunction Multilayer Structure

Before being transferred to a frontside glass cover, which acts as a supporting structure for subsequent fabrication processes, a heterojunction multilayer structure is first formed on a low-cost MG-Si substrate. FIG. 2 presents a diagram illustrating the process of fabricating a heterojunction multilayer structure in accordance with an embodiment of the present invention.

In operation 2A, an MG-Si substrate 200 is prepared. Because MG-Si is much cheaper than solar grade or semiconductor grade c-Si, solar cells based on MG-Si substrates have a significantly lower manufacture cost. The purity of MG-Si is usually between 98% and 99.99%. To ensure high efficiency of the subsequently fabricated solar cell, the starting MG-Si substrate ideally has a purity of 99.9% or better. Prior to any fabrication processes, a low-cost MG-Si wafer (with resistivity between 0.001 Ohm-cm and 0.1 Ohm-cm) undergoes an acidic chemical polish to remove any surface defects and to produce a smooth surface. In one embodiment, the acidic chemical polish process uses HF, $HNO_3$, and other additives.

In operation 2B, a porous Si bi-layer structure is formed on the surface of MG-Si substrate 200. Porous Si bi-layer structure 202 includes a low-porosity Si layer 204 and a high-porosity Si layer 206. In some embodiments, layer 204 has a porosity level between 15% and 30% and a thickness between 0.8 μm and 1.5 μm. In some embodiments, layer 206 has a porosity level between 50% and 70% and a thickness between 0.1 μm and 0.3 μm. To construct bi-layer structure 202, some embodiments etch the surface of the MG-Si wafer using an electrochemical etching technique which applies HF solution and a current. The desired Si porosity level and porous layer thickness can be achieved by controlling the current density. The combination of a layer with high porosity and a layer with low porosity ensures not only an easier separation of the substrate (requires high porosity beneath the surface) but also a high-quality epitaxial film growth (requires low porosity at the surface). Some embodiments form multiple porous Si layers on the surface of MG-Si substrate 200.

Operation 2B also includes a process that can further purify the surface of the MG-Si wafer to ensure the quality of the subsequent epitaxial growth. In one embodiment, MG-Si substrate 200 is baked at a temperature between 1100° C. and 1250° C. in a chemical-vapor-deposition (CVD) chamber filled with hydrogen ($H_2$) in order to remove native silicon-oxide in the substrate. Afterwards, at approximately the same temperature, hydrogen chloride (HCl) gas is introduced inside the CVD chamber to leach out any residual metal impurities from MG-Si substrate 200, thus further preventing the impurities from diffusing into the subsequently grown c-Si thin films. Due to the fact that metal impurities, such as iron, have a high diffusion coefficient at this temperature, the metal impurities tend to migrate to the surface of substrate 200, and react with the HCl gas to form volatile chloride compounds. The volatile chloride compounds can be effectively purged from the chamber using a purge gas, such as $H_2$. Note that the metal-impurity leaching process can be carried out either in the CVD chamber, which is subsequently used for the growth of crystalline-Si thin films, or in another stand-alone furnace. The metal-impurity leaching process can take between 1 minute and 120 minutes. MG-Si substrate 200 can be either p-type doped or n-type doped. In one embodiment, MG-Si substrate is n-type doped. Also note that in addition to an MG-Si substrate, it is also possible to use a more expensive Floatzone, Caochralski, or solar grade wafer as a growth substrate.

In operation 2C, a thin layer of heavily doped (doping concentration greater than $1\times10^{17}/cm^3$) c-Si thin film 210 is epitaxially grown on the surface of low-porosity Si layer 204. Various methods can be used to epitaxially grow c-Si thin film 210 on MG-Si substrate 200. In one embodiment, c-Si thin film 210 is grown using a thermal CVD process. Various types of Si compounds, such as $SiH_4$, $SiH_2Cl_2$, and $SiHCl_3$, can be used as a precursor in the CVD process to form c-Si thin film 210. In one embodiment, $SiHCl_3$ (TCS) is used due to its abundance and low cost. C-Si thin film 210 can be either p-type doped or n-type doped. In one embodiment, c-Si thin film 210 is n-type doped. The doping concentration of thin film 210 can be between $1\times10^{17}/cm^3$ and $1\times10^{20}/cm^3$, and the thickness of thin film 202 can be between 1 μm and 10 μm. The doping level should not exceed a maximum limit, which may cause misfit dislocations in the film. C-Si thin film 210 is heavily doped to act as back-surface field (BSF), impurity barrier, and contaminant getter layer for reducing electron-hole recombination at the surface of the subsequently grown base film.

In operation 2D, a layer of lightly doped (doping concentration less than $1\times10^{17}/cm^3$) c-Si base film 212 is epitaxially grown on top of thin film 210. The growth process of base film 212 can be similar to that used for thin film 210. Similarly, base film 212 can be either p-type doped or n-type doped. In one embodiment, base film 212 is lightly doped with an n-type dopant, such as phosphorus. The doping concentration of base film 212 can be between $1\times10^{16}/cm^3$ and $1\times10^{17}/cm^3$, and the thickness of base film 212 can be between 5 μm and 100 μm. After film deposition, in operation 2E, the surface of base film 212 is textured to maximize light absorption inside the solar cell, thus further enhancing efficiency. The surface texturing can be performed using various etching techniques including dry plasma etching and wet chemical etching. The etchants used in the dry plasma etching include, but are not limited to: $SF_6$, $F_2$, and $NF_3$. The wet chemical etchant can be an alkaline solution. The shapes of the surface texture can be pyramids or inverted pyramids, which are randomly or regularly distributed on the surface of base film 212.

In operation 2F, a passivation layer 214 is deposited on top of base film 212. Passivation layer 214 can significantly reduce the density of surface minority-carrier recombination via hydrogenation passivation of surface defect states, as well as by the built-in heterojunction bandgap offset, hence resulting in higher solar cell efficiency. Passivation layer 214 can be formed using different materials such as intrinsic a-Si or silicon-oxide ($SiO_x$). Techniques used for forming passivation layer 214 include, but are not limited to: PECVD, sputtering, and electron beam (e-beam) evaporation. The thickness of passivation layer 214 can be between 2 nm and 10 nm. Note that such thickness is thin enough to allow tunneling of majority carriers, thus ensuring low series resistance of the solar cell. In some embodiments, a mixture of $SiH_4$ and $H_2$ gases is injected into a PECVD chamber at a pressure of 250-750 mTorr, an RF power of 20-75 mW/cm², and a temperature of 100-200° C. in order to form passivation layer 214 that includes intrinsic a-Si.

In operation 2G, a heavily doped a-Si layer is deposited on passivation layer 214 to form an emitter layer 216. Depending on the doping type of base film 212, emitter layer 216 can be either n-type doped or p-type doped. In one embodiment, emitter layer 216 is heavily doped with a p-type dopant. The doping concentration of emitter layer 216 can be between $1 \times 10^{17}/cm^3$ and $1 \times 10^{20}/cm^3$. The thickness of emitter layer 216 can be between 10 nm and 50 nm. Techniques used for depositing emitter layer 216 include PECVD. Some embodiments form emitter layer 216 by injecting a mixture of $B_2H_6$ (or $PH_3$), $SiH_4$ and $H_2$ gases into a PECVD chamber operating at a pressure of 250-750 mTorr, an RF power of 20-75 $mW/cm^2$, and a temperature of 125-250° C. The ultra-thin a-Si layer stack, which includes passivation (intrinsic a-Si) layer 214 and heavily doped a-Si layer 216, can improve the absorption efficiency of short wavelength incident light of the solar cell, thus leading to higher efficiency.

In operation 2H, a layer of transparent-conducting-oxide (TCO) is deposited on top of emitter layer 216 to form a conductive anti-reflection layer 218. Examples of TCO include, but are not limited to: indium-tin-oxide (ITO), tin-oxide ($SnO_x$), aluminum doped zinc-oxide (ZnO:Al), or Ga doped zinc-oxide (ZnO:Ga). Techniques used for forming anti-reflection layer 218 include, but are not limited to: PECVD, sputtering, and e-beam evaporation.

In operation 2I, an edge isolation process is performed to each individual solar cell to ensure electrical insulation between emitter layer 216 and base film 212. The edge isolation can be done using at least one of the following techniques: chemical wet etching, plasma dry etching, and laser scribing.

In operation 2J, frontside electrode grid 220 is formed on top of anti-reflection layer 218. Frontside electrode grid 220 can be formed using various metal deposition techniques including, but not limited to: screen printing of Ag paste, aerosol printing of Ag ink, and e-beam evaporation. The formation of frontside electrode grid completes the fabrication of a multilayer structure with front heterojunction. It is important to ensure that an ohmic contact is formed between frontside electrode grid 220 and anti-reflection layer 218 by using a suitable work function. In some embodiments, a sorting process is performed after the completion of the heterojunction multilayer structure.

Layer Transfer

In order to passivate the backside of base film 212, some embodiments of the present invention remove the MG-Si substrate and transfer the previously completed heterojunction multilayer structure to a glass cover. FIG. 3 presents a diagram illustrating the process of transferring the multilayer structure to a glass cover in accordance with an embodiment of the present invention.

In operation 3A, multiple previously fabricated heterojunction multilayer structures, including structure 302, are arranged in a modular configuration 300. Various modular configurations can be applied. For example, module configuration 300 shown in FIG. 3A demonstrates a 6-cell configuration. Other configurations including different numbers of cells, such as 36, 72, and 96 cells, and different geometric configurations, such as a regular matrix formation or irregular formations, are also possible. Note that each individual structure can be hold in place by a vacuum chuck with frontside electrode grid 304 facing up. FIG. 3A demonstrates the top view of modular configuration 300.

In operation 3B, a layer of metal wires/mesh is laid on top of each multilayer structure to provide electrical connection to the frontside of the multilayer structure. For example, metal wires/mesh 306 is placed in such a way that the wires run vertically across frontside electrode grid 304. In one embodiment, metal wires 306 include tin-lead-silver coated Cu wires.

In operation 3C, an adhesive polymer layer 308 is placed on top of all multilayer structures embedding the metal wires/mesh. To ensure excellent light transmission, the refractive index of adhesive polymer layer 308 matches that of a subsequently applied frontside glass cover. Examples of index-matching polymer include, but are not limited to: ethylene-vinyl acetate (EVA), acrylic, polycarbonate, polyolefin, and thermal plastic.

In operation 3D, a frontside glass cover/superstrate 310 is placed on top of adhesive polymer layer 308, and heat and pressure are applied to cure polymer layer 308. As the result of the curing, the multilayer structures are laminated on polymer layer 308, and polymer layer 308 is laminated on frontside glass cover 310. In addition, during the lamination process, metal wires/mesh 306 is soldered to corresponding frontside electrode grid 304, thus forming corresponding bus bars. Note that the one-step lamination and soldering process is a cost-effective way to realize electrical connection and the frontside protection of the solar cell module. In some embodiments, the temperature for curing polymer layer 308 is between 150° C. and 180° C.

FIG. 3E illustrates the side view of a solar cell module after the lamination of a front cover glass in accordance with an embodiment of the present invention. Note that the sequence of operations for achieving the configuration shown in FIG. 3E can be different than the sequence shown in FIGS. 3A-3D. In some embodiments, polymer layer 308 and metal wires/mesh 306 are laid on the surface of frontside glass cover 310 sequentially, and the multilayer structures are flipped upside down to be placed on corresponding metal wires/mesh 306.

Once the frontside of multilayer structures 302 is protected, it is possible to perform layer transferring, during which MG-Si substrate 200 is removed. In operation 3F, a vacuum chuck 312 with uniform vacuum is applied to frontside glass cover 310 and a vacuum chuck 314 is applied to the backside of each multilayer structure in order to remove MG-Si substrate 200 via mechanical forces. Due to the existence of high porosity Si layer 206, which forms a line of weakness, MG-Si substrate 200 can be separated from the rest of the multilayer structure 302. Various techniques can be used to separate MG-Si substrate 200 from structure 302, including but not limited to: chemical wet etching, applying shear or piezoelectric forces, applying a temperature gradient, applying ultra/mega-sonic resonance force, applying tensile or compressive mechanical forces, and pumping a pressurized gas (such as $H_2$) into the porous Si region. Note that the detachment of MG-Si substrate 200 can be separately performed for each individual multilayer structure, or in a batch for the whole module. Detached MG-Si substrate 200 can be subsequently recycled and reused as a substrate for a new epitaxial growth, thus significantly reducing the cost of the solar cell fabrication process. Some embodiments use various etching methods, such as chemical wet etching, plasma dry etching, and chemical mechanical polishing, to etch off MG-Si substrate 200. In these scenarios, the cost savings of recycling/reusing MG-Si substrate 200 are forfeited.

Backside Passivation

After the detachment/removal of MG-Si substrates, the backside of the c-Si base films becomes accessible for passivation. FIG. 4 presents a diagram illustrating the process of fabricating backside heterojunctions in accordance with an embodiment of the present invention.

In operation 4A, the solar cell module is flipped over and the residual porous Si layer is removed to expose the backside of epitaxial c-Si films including BSF layer 210. For better demonstration, FIG. 4A only shows the cross section of one solar cell. It is advantageous to remove the residual porous Si layer because its high-density defects sites can result in increased minority carrier recombination at the back surface of the solar cell, thus reducing cell efficiency. Various etching techniques, such as chemical wet etching, can be used to remove the residual porous Si layer.

In operation 4B, the backside of the solar cell is textured using either chemical wet etching or plasma dry etching techniques. The texturing can significantly improve the amount of light absorbed by c-Si films, including BSF layer 210 and base film 212.

Operation 4C is an optional operation, during which a protective "mask" 402 is applied to the solar cell module. Mask 402 covers the entire solar cell module, including the polymer/glass regions between solar cells, except for the backside of individual solar cells. Protective mask 402 can be formed by a Tyflon® release paper which can subsequently be easily peeled off, or by a loading and unloading panel cartridge with cutouts.

In operation 4D, an ultra-thin backside passivation layer 404 is deposited. The material and techniques used to perform operation 4D are similar to those of operation 2F. For example, passivation layer 404 can include intrinsic a-Si or $SiO_x$. The thickness of backside passivation layer 404 can be between 2 nm and 10 nm.

In operation 4E, a heavily doped a-Si layer 406 is deposited on top of backside passivation layer 404. The deposition process of a-Si layer 406 is similar to that of operation 2G. Depending on the doping type of base film 212, heavily doped a-Si layer 406 can be n-type doped or p-type doped. In one embodiment, heavily doped a-Si layer 406 is n-type doped. The formation of a heterojunction between the a-Si layers (layers 404 and 406) and base film 212 creates a potential barrier for minority carriers at the backside of base film 212, thus effectively decreasing minority carrier recombination at the back surface. Consequently, higher solar cell efficiency (greater than 19.5%) can be achieved. In some embodiments, operations 4D and 4E are skipped, resulting in a single-sided heterojunction solar cell, which may have lower cell efficiency. However, by skipping the deposition of the a-Si stack (layers 404 and 406), the solar cell module can avoid the high temperature and high pressure PECVD process, thus preserving the integrity of frontside adhesive polymer layer 308.

In operation 4F, a TCO layer 408 is deposited to make both an anti-reflection layer and a conductive layer. The process of forming TCO layer 408 is similar to operation 2H.

In operation 4G, a backside electrode 410 is formed on top of TCO layer 408. In some embodiments, backside electrode 410 can be in a grid pattern instead of covering the whole backside. Techniques for depositing backside electrode 410 can include Ag or Al screen printing and metal evaporation.

In operation 4H, protective mask 402 is removed. Note that in cases where no protective mask is applied, an edge isolation operation, such as laser isolation, will be performed after operation 4F to eliminate possible short circuits among the cells.

Backside Glass Cover

After the fabrication of the backside heterojunction, a protective backside glass/polymer cover is applied to the backside of the solar cell module. The process of applying the backside glass/polymer cover is similar to that of the frontside glass cover. FIG. 5 presents a diagram illustrating a process of applying a backside protective cover to the solar cell module in accordance with an embodiment of the present invention.

In operation 5A, a partially finished solar cell module 500 is placed with the backside of solar cells, such as solar cell 502 and solar cell 504, facing upward, whereas glass cover/superstrate 506 is facing downward.

In operation 5B, a layer of metal wires/mesh is pre-laid on the backside of each individual solar cell. For example, metal wire/mesh 508 is placed on the backside of solar cell 502, thus providing electrical access to the backside electrode of cell 502. In some embodiments, metal wires 508 include tin-lead-silver coated Cu wires. Note that all backside metal wires/meshes are placed in such a way that they are aligned to corresponding frontside metal wires/meshes to form a series of interconnected solar cells as required in a solar cell module arrangement. For example, metal mesh 508 is placed so that its solder tab 510 is directly contacting the solder tab of the frontside metal mesh of solar cell 504, thus forming a series connection between solar cell 502 and solar cell 504.

In operation 5C, a layer of adhesive polymer 512 is placed on the backside of module 500. Ideally, adhesive polymer layer 512 has a low refractive index and an excellent light transmission coefficient. Materials that can be used to form adhesive polymer layer 512 include, but are not limited to: ethylene-vinyl acetate (EVA), acrylic, polycarbonate, polyolefin, and thermal plastic.

In operation 5D, a layer of protective backside cover 514 is placed on top of polymer layer 512, and heat and pressure are applied to concurrently cure polymer layer 512 and solder backside metal wires/mesh to the backside electrodes. Backside cover 514 can be formed using glass or a polymer, such as Tedlar®. The curing of polymer layer 512 results in the lamination of backside cover 514 to solar cell module 500. In addition, the lamination process involves adhesion and vacuum sealing between frontside polymer layer 308 and backside polymer layer 512. As a result, solar cell module 500 is sealed between the frontside glass superstrate and the backside cover, thus preventing damages caused by exposure to environmental factors. Subsequently, a standard framing/trimming process and formation of a junction box are performed to finish the manufacture of solar cell module 500. In the end, the completed solar cell module is tested. FIG. 5E illustrates the side view of a completed solar cell module in accordance with an embodiment of the present invention.

Single Wafer Process

In some embodiments, instead of using a modular process to fabricate the backside heterojunctions, a single wafer process is applied to fabricate individual solar cells before putting them into a module. FIG. 6 presents a diagram illustrating a process of fabricating a double-sided heterojunction single wafer solar cell in accordance with an embodiment of the present invention.

In operation 6A, a layer of metal wires/mesh 606 is pre-laid on top of a previously fabricated (after the completion of operation 2J) single-wafer frontside heterojunction multilayer structure 602, which is placed with its frontside electrode grid 604 facing upward.

In operation 6B, multilayer structure 602 is attached to a layer of adhesive polymer 608 via a lamination process. During the lamination process, metal wires/mesh 606 is soldered to frontside electrode 604.

In operation 6C, vacuum chucks are attached to polymer layer 608 and MG-Si substrate 612 to separate the MG-Si substrate from the epitaxial c-Si films. Techniques that can be used to separate MG-Si substrate 612 are similar to the ones used in operation 3F.

In operation 6D, the single wafer solar cell undergoes backside processing similar to the ones in operations 4A-4H to accomplish backside texturing, depositing a passivation layer 614, depositing a heavily doped a-Si layer 616, depositing a TCO layer 618, and depositing a backside electrode grid 620.

In operation 6E, the frontside polymer layer 608 is partially removed to expose the frontside metal wires/mesh 606, thus enabling cell level testing and sorting.

In operation 6F, the selected individual solar cells are arranged in a modular configuration before applying a frontside polymer layer 622, a backside metal wires/mesh 624, and a backside polymer layer 626. Note that backside metal wires/mesh 624 is aligned to corresponding frontside metal wires/mesh in order to form a series of interconnected solar cells.

In operation 6G, a frontside glass superstrate 628 and a backside protective cover 630, which can be made of glass or Tedlar®, are laminated to the solar cell module via curing of polymer layers 622 and 626. Similarly, backside metal wires/mesh 624 is soldered to backside electrode grid 620 during the lamination process.

In operation 6H, a standard framing/trimming process and the formation of a junction box are performed to finish the manufacture of solar cell module 600.

The foregoing descriptions of various embodiments have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention.

What is claimed is:

1. A double-sided heterojunction solar cell, comprising:
   a frontside glass cover;
   a semiconductor multilayer structure situated below the frontside glass cover, comprising:
      a frontside electrode grid,
      a first layer of heavily doped amorphous Si (a-Si) acting as an emitter layer situated below the frontside electrode, and
      a layer of lightly doped crystalline-Si (c-Si) acting as a base layer situated below the first layer of heavily doped a-Si,
   a second layer of heavily doped a-Si situated below the multilayer structure, wherein the second heavily doped a-Si layer and the lightly doped c-Si base layer have a same conductive doping type;
   a backside electrode situated below the second layer of heavily doped a-Si;
   a backside glass cover situated below the backside electrode;
   a frontside metal mesh situated between the frontside glass cover and the semiconductor multilayer structure; and
   a backside metal mesh situated between the backside glass cover and the semiconductor multilayer structure, wherein the backside metal mesh is arranged in such a way that a solder tab of the backside metal mesh is in contact with a solder tab of a second frontside metal mesh belonging to an adjacent solar cell, thereby enabling a serial connection between the solar cell and the adjacent solar cell.

2. The solar cell of claim 1, wherein the multilayer structure is epitaxially grown on a metallurgical-Si (MG-Si) substrate.

3. The solar cell of claim 2, wherein the MG-Si substrate further comprises a layer of porous Si.

4. The solar cell of claim 2, wherein the MG-Si substrate is removed prior to the formation of the second layer of heavily doped a-Si, and wherein the MG-Si substrate is removed using one or more of the following techniques:
   chemical etching;
   applying a shear or piezoelectric force;
   applying a temperature gradient;
   applying an ultra/mega-sonic force;
   applying a tensile or compressive mechanical force; and
   pumping a pressurized gas into the porous Si layer.

5. The solar cell of claim 1, wherein at least one side of the lightly doped c-Si layer is textured.

6. The solar cell of claim 1, further comprising a first adhesive polymer layer situated between the frontside glass cover and the multilayer structure, and wherein the adhesive polymer layer, the frontside glass cover, and the multilayer structure are laminated together by applying heat and pressure.

7. The solar cell of claim 6, wherein the frontside metal mesh is embedded within the polymer layer; and wherein the frontside metal mesh is soldered to the frontside electrode grid during the lamination process.

8. The solar cell of claim 6, wherein the refractive index of the polymer matches the glass's refractive index.

9. The solar cell of claim 1, further comprising a second adhesive polymer layer situated between the backside glass cover and the backside electrode, and wherein the backside electrode comprises Ag or Al finger grid.

10. The solar cell of claim 8, wherein the backside metal mesh is embedded within the second polymer layer, and wherein the backside metal mesh is soldered to the backside electrode grid while the second adhesive polymer layer is cured.

11. The solar cell of claim 1, further comprising at least one layer of transparent conductive oxide (TCO) material situated between an electrode and a heavily doped a-Si layer.

12. The solar cell of claim 1, wherein the lightly doped c-Si layer is deposited using a CVD technique, wherein the thickness of the lightly doped c-Si layer is between 5 μm and 100 μm, and wherein the doping concentration for the lightly doped c-Si layer is between $1\times10^{16}/cm^3$ and $1\times10^{17}/cm^3$.

13. The solar cell of claim 1, wherein at least one heavily doped a-Si layer is deposited using a CVD technique, wherein the thickness of the at least one heavily doped a-Si layer is between 10 nm and 50 nm, and wherein the doping concentration for the at least one heavily doped a-Si layer is between $1\times10^{17}/cm^3$ and $1\times10^{20}/cm^3$.

14. The solar cell of claim 1, wherein the semiconductor multilayer structure further comprises a layer of heavily doped c-Si situated below the lightly doped c-Si layer, wherein the heavily doped and lightly doped c-Si layers are n-type doped, wherein the first heavily doped a-Si layer is p-type doped, and wherein the second heavily doped a-Si layer is n-type doped.

15. The solar cell of claim 14, wherein the heavily doped c-Si layer acts as a back-surface-field (BSF) layer, wherein the heavily doped c-Si layer is deposited using a chemical-vapor-deposition (CVD) technique, wherein the thickness of the heavily doped c-Si layer is between 1 μm and 10 μm, and wherein the doping concentration for the heavily doped c-Si layer is between $1\times10^{17}/cm^3$ and $1\times10^{20}/cm^3$.

16. The solar cell of claim 1, wherein the multilayer structure further comprises a passivation layer situated between the first layer of heavily doped a-Si and the layer of lightly doped c-Si, wherein the thickness of the passivation layer is between 1 nm and 10 nm, and wherein the passivation layer includes at least one of: undoped a-Si and $SiO_x$.

17. A double-sided heterojunction solar cell module, comprising:
    a frontside glass cover;
    a backside glass cover situated below the frontside glass cover; and
    a number of solar cells situated between the frontside glass cover and the backside glass cover, wherein each solar cell comprises:
        a semiconductor multilayer structure situated below the frontside glass cover, comprising:
            a frontside electrode grid,
            a first layer of heavily doped amorphous Si (a-Si) acting as an emitter layer situated below the frontside electrode, and
            a layer of lightly doped crystalline-Si (c-Si) acting as a base layer situated below the first layer of heavily doped a-Si,
        a second layer of heavily doped a-Si situated below the multilayer structure, wherein the second heavily doped a-Si layer and the lightly doped c-Si base layer have a same conductive doping type;
        a backside electrode situated below the second layer of heavily doped a-Si;
        a frontside metal mesh situated between the frontside glass cover and the semiconductor multilayer structure; and
        a backside metal mesh situated between the backside glass cover and the semiconductor multilayer structure, wherein the backside metal mesh is arranged in such a way that a solder tab of the backside metal mesh is in contact with a solder tab of a second frontside metal mesh belonging to an adjacent solar cell, thereby enabling a serial connection between the solar cell and the adjacent solar cell.

18. The solar cell module of claim 17, wherein the multilayer structure is epitaxially grown on a metallurgical-Si (MG-Si) substrate.

19. The solar cell module of claim 18, wherein the MG-Si substrate further comprises a layer of porous Si.

20. The solar cell module of claim 19, wherein the MG-Si substrate is removed prior to the formation of the second layer of heavily doped a-Si, and wherein the MG-Si substrate is removed using one or more of the following techniques:
    chemical etching;
    applying a shear or piezoelectric force;
    applying a temperature gradient;
    applying an ultra/mega-sonic force;
    applying a tensile or compressive mechanical force; and
    pumping a pressurized gas into the porous Si layer.

21. The solar cell module of claim 17, wherein at least one side of the lightly doped c-Si layer is textured.

22. The solar cell module of claim 17, further comprising a first adhesive polymer layer situated between the frontside glass cover and the solar cells, and wherein the adhesive polymer layer, the frontside glass cover, and the solar cells are laminated together by applying heat and pressure.

23. The solar cell module of claim 22, wherein the frontside metal mesh is embedded within the polymer layer, and wherein the frontside metal mesh is soldered to the frontside electrode grid during the lamination process.

24. The solar cell module of claim 22, wherein the refractive index of the polymer matches the glass's refractive index.

25. The solar cell module of claim 17, further comprising a second adhesive polymer layer situated between the backside glass cover and the backside electrode, and wherein the backside electrode comprises Ag or Al finger grid.

26. The solar cell module of claim 25, wherein the backside metal mesh is embedded within the second polymer layer, and wherein the backside metal mesh is soldered to the backside electrode grid while the second adhesive polymer layer is cured.

27. The solar cell module of claim 17, wherein the frontside glass region between individual solar cells is protected by a mask during a subsequent fabrication process.

28. The solar cell module of claim 17, wherein each solar cell further comprises at least one layer of transparent conductive oxide (TCO) material situated between an electrode and a heavily doped a-Si layer.

29. The solar cell module of claim 17, wherein the lightly doped c-Si layer is deposited using a CVD technique, wherein the thickness of the lightly doped c-Si layer is between 5 µm and 100 µm, and wherein the doping concentration for the lightly doped c-Si layer is between $1 \times 10^{16}/cm^3$ and $1 \times 10^{17}/cm^3$.

30. The solar cell module of claim 17, wherein at least one heavily doped a-Si layer is deposited using a CVD technique, wherein the thickness of the at least one heavily doped a-Si layer is between 10 nm and 50 nm, and wherein the doping concentration for the at least one heavily doped a-Si layer is between $1 \times 10^{17}/cm^3$ and $1 \times 10^{20}/cm^3$.

31. The solar cell module of claim 17, wherein the semiconductor multilayer structure further comprises a layer of heavily doped c-Si situated below the lightly doped c-Si layer, wherein the heavily doped and lightly doped c-Si layers are n-type doped, wherein the first heavily doped a-Si layer is p-type doped, and wherein the second heavily doped a-Si layer is n-type doped.

32. The solar cell module of claim 31, wherein the heavily doped c-Si layer acts as a back-surface-field (BSF) layer, wherein the heavily doped c-Si layer is deposited using a chemical-vapor-deposition (CVD) technique, wherein the thickness of the heavily doped c-Si layer is between 1 µm and 10 µm, and wherein the doping concentration for the heavily doped c-Si layer is between $1 \times 10^{17}/cm^3$ and $1 \times 10^{20}/cm^3$.

33. The solar cell of claim 17, wherein the multilayer structure further comprises a passivation layer situated between the first layer of heavily doped a-Si and the layer of lightly doped c-Si, wherein the thickness of the passivation layer is between 1 nm and 10 nm, and wherein the passivation layer includes at least one of: undoped a-Si and $SiO_x$.

* * * * *